(12) United States Patent
Kishimoto

(10) Patent No.: US 6,383,898 B1
(45) Date of Patent: May 7, 2002

(54) METHOD FOR MANUFACTURING PHOTOELECTRIC CONVERSION DEVICE

(75) Inventor: Katsushi Kishimoto, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/577,879

(22) Filed: May 25, 2000

(30) Foreign Application Priority Data

May 28, 1999 (JP) .............................. 11-150270
Dec. 28, 1999 (JP) .............................. 11-374085

(51) Int. Cl.⁷ .............................................. H01L 21/20
(52) U.S. Cl. ...................................... 438/482; 438/485
(58) Field of Search ................................. 438/482, 485

(56) References Cited

U.S. PATENT DOCUMENTS

| | | | | | |
|---|---|---|---|---|---|
| 5,007,971 | A | * | 4/1991 | Kanai et al. ................. | 136/258 |
| 5,288,658 | A | * | 2/1994 | Ishihara ....................... | 438/482 |
| 5,527,391 | A | * | 6/1996 | Echizen et al. .............. | 118/719 |
| 5,644,145 | A | * | 7/1997 | Ishihara ....................... | 257/52 |
| 5,811,873 | A | * | 9/1998 | Soejima ....................... | 257/655 |
| 6,140,666 | A | * | 10/2000 | Yamanobe .................... | 257/53 |

FOREIGN PATENT DOCUMENTS

| | | |
|---|---|---|
| JP | 57-126175 A | 8/1982 |
| JP | 3-40515 B2 | 6/1991 |
| JP | 4-321277 A | 11/1992 |
| JP | 7-22638 A | 1/1995 |
| JP | 11-354820 A | 12/1999 |

* cited by examiner

Primary Examiner—T. N. Quach
(74) Attorney, Agent, or Firm—Nixon & Vanderhye P.C.

(57) ABSTRACT

A photoelectric conversion device including a plurality of pin junction layers, wherein at least a p-layer adjacent to an n-layer is formed of a stack of an amorphous silicon layer as a first p-layer and an amorphous silicon layer as a second p-layer, the first p-layer having a thickness of 5 nm or less and containing a p-type impurity and an n-type impurity, and the second p-layer having a p-type impurity concentration gradually decreasing as it is closer to an i-layer.

22 Claims, 6 Drawing Sheets

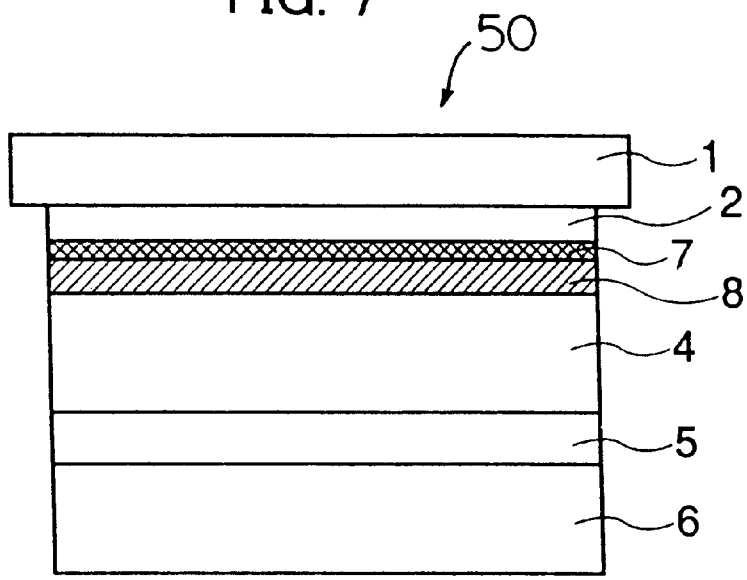
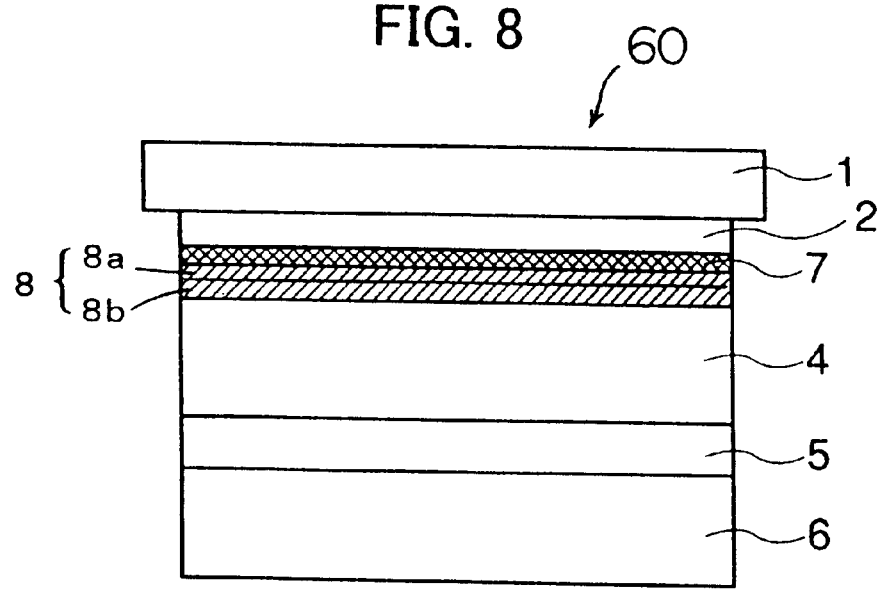

METHOD FOR MANUFACTURING PHOTOELECTRIC CONVERSION DEVICE

CROSS-REFERENCE TO RELATED APPLICATION

This application is related to Japanese application No. Hei 11(1999)-150270 filed on May 28, 1999 and Hei 11(1999)-374085 filed on Dec. 28, 1999, whose priorities are claimed under 35 USC §119, the disclosure of which are incorporated by reference in those entirety.

BACKGROUND OF THE INVENTION

1. Field of the Invention

The present invention relates to a photoelectric conversion device and a method for manufacturing the same. More particularly, it relates to a photoelectric conversion device to be used for a thin film solar battery or the like formed by sandwiching a pin junction layer as a photoelectric conversion layer with electrodes, and a method for manufacturing the same.

2. Description of the Related Art

Various efforts have been made on the development of doped layers provided on the light-incident side of thin film solar batteries, which are one of important factors that relate to improvement of conversion efficiency. Especially, various researches are being made on p-layers which are one of doped layers on the light-incident side. The p-layers serve as amorphous silicon type window layers, but they are not photoelectric conversion layers themselves and must therefore satisfy contradicting requirements for a smaller amount of light absorption and preferable p-i interface characteristics with high conductivity.

For example, Japanese examined patent publications No. H3(1991)-40515 and No. H3(1991)-63229 disclose methods in which an a-SiC film doped with boron is used as a p-layer.

Those publications disclose methods for forming a p-layer by decomposing $B_2H_6$ gas along with a mixture of gases such as silane or silane-derivative (e.g., $SiH_4$), carbon hydride (e.g., $CH_4$), $H_2$ and the like by glow discharge. Other commonly known methods include plasma CVD.

To form a photoelectric conversion layer on a light-transmissive substrate such as glass, it is a normal practice to fabricate a light-transmissive metal oxide film such as ITO, $SnO_2$ or the like on the glass since light is incident on the substrate side. A plasma CVD process is performed using a material gas (e.g., $B_2H_6$, $SiH_4$, $GeH_4$, $CH_4$ or the like) and a mixture of gases added with $H_2$ to form an a-Si film, an i-layer and an n-layer sequentially.

However, when plasma of $B_2H_6$ gas is generated on such a metal oxide film, boron radicals abstract hydrogen which terminates bonds of Si in the a-Si film and a great number of uncombined bonds referred to as "dangling bonds" are formed, causing reduction of the metal oxide film. This darkens the metal oxide film. This increases the amount of light absorption of the p-layer serves as a window layer and decreases the light transmittance of the metal oxide film, which results in a remarkable decrease in a short-circuit current of the device.

In addition, since boron in the plasma also increases uncombined bonds on the surface of the film, a great number of recombination levels are generated at the p-i interface, which significantly causes a harmful influence on conversion efficiency. For example, when a SiC film doped with boron is used as the p-layer, the film is not preferably bonded to the photoelectric conversion layer, which makes it impossible to maintain sufficient Voc and F.F. Accordingly, a buffer layer (intrinsic SiC film) is normally inserted at the p-i interface. However, this layer is less conductive, which increases the internal resistance of the device and consequently reduces F.F.

Thus, delicate adjustments must be performed to hold the reduction of the conductivity at a minimum level and decrease the light absorption amount as small as possible.

Japanese unexamined patent publication No. H7(1995)-22638 discloses a method for manufacturing a p-layer in which a p-type amorphous silicon layer is formed by fabricating a laminate of an amorphous boron layer and an amorphous silicon layer. Further, Applied Physics 36, 467 (1997) proposes a method for forming a p-layer in which a laminate of an amorphous boron layer and an amorphous carbon layer is formed. However, it is still difficult to sufficiently reduce the amount of light absorption with the amorphous boron layer.

It is quite effective to coat the surface of the metal oxide film with ZnO or the like in order to suppress reduction of the metal oxide film. This increases the number of processing steps and the production costs.

In order to provide a high photoelectric conversion rate by making efficient use of spectra of sunbeams, widely used are tandem photoelectric conversion devices which have a structure in which a plurality of pin junction layers are stacked. In such photoelectric conversion devices, an optical band gap is optionally set in a photoelectric conversion layer in each of the pin junction layers to allow efficient use of a photoelectric current generated in each of the pin junction layers. However, an interface between the p-layer located in the middle and the n-layer adjacent to the p-layer inevitably exists. As a result, the quality of the film is sacrificed for obtaining preferable ohmic contact and, in practice, a recombined layer of about 3 nm that absorbs a great amount of light must be inserted at the interface.

Further, in such tandem photoelectric conversion devices, in general, the intermediate p-layer adjacent to the n-layer is formed by stacking a contact layer (a heavily doped a-Si layer) for establishing ohmic contact with the underlying adjacent n-layer and a silicon alloy film having a wide gap such as an a-SiC or a-SiO film. Problems arise in that the contact layer which is an inactive layer results in a great loss of light absorption and in that the series resistance of the silicon alloy film having a wide gap such as an a-SiC or a-SiO film increases beyond a negligible degree to reduce the F.F. of the photoelectric conversion device.

Thus, in the tandem photoelectric conversion devices formed by stacking a plurality of pin junction layers, it has been very difficult with conventional methods to obtain a window layer which meets the requirements of excellent interface characteristics for both of an n-type amorphous silicon layer (or microcrystalline silicon layer) and a photoelectric conversion layer by using a p-type doped layer having small light absorption and high conductivity.

The present invention has been made taking the above-described problems into consideration, and an object of the invention is to provide a photoelectric conversion device having small light absorption, high conductivity and preferable interface characteristics, and a method for manufacturing the same.

SUMMARY OF THE PRESENT INVENTION

According to the present invention, provided is a photoelectric conversion device including a plurality of pin junction layers, wherein at least a p-layer adjacent to an n-layer is comprised of a stack of an amorphous silicon layer as a first p-layer and an amorphous silicon layer as a second p-layer, the first p-layer having a thickness of 5 nm or less and containing a p-type impurity and an n-type impurity, and the second p-layer having a p-type impurity concentration gradually decreasing as it is closer to an i-layer.

The above-mentioned photoelectric conversion device is formed in accordance with a method for manufacturing a photoelectric conversion device including a plurality of pin junction layers comprising the steps of: forming a first p-layer of an amorphous silicon layer containing a p-type impurity and an n-type impurity adjacently to an n-layer; and forming a second p-layer of an amorphous silicon layer on the first p-layer adjacent to the n-layer by discharge-decomposition of a material gas not containing the p-type impurity, the second p-layer having a p-type impurity concentration gradually decreasing as it is closer to an i-layer.

According to another aspect of the present invention, provided is a method for manufacturing a photoelectric conversion device including one or plural pin junction layer(s), wherein a p-layer is provided by forming an amorphous silicon layer as a first p-layer with a thickness of 5 nm or less containing at least a p-type impurity by use of a material gas and a diluent gas of at least one kind of inert gas free from a reducing gas, and forming on the first p-layer an amorphous silicon layer as a second p-layer having an impurity concentration which gradually decreases as it is closer to an i-layer.

BRIEF DESCRIPTION OF THE DRAWINGS

FIG. 7 is a schematic sectional view of major parts illustrating an embodiment of a single-layered photoelectric conversion device according to the invention.

FIG. 8 is a schematic sectional view of major parts illustrating another embodiment of the single-layered photoelectric conversion device according to the invention.

DETAILED DESCRIPTION OF THE PREFERRED EMBODIMENTS

Figure 1:
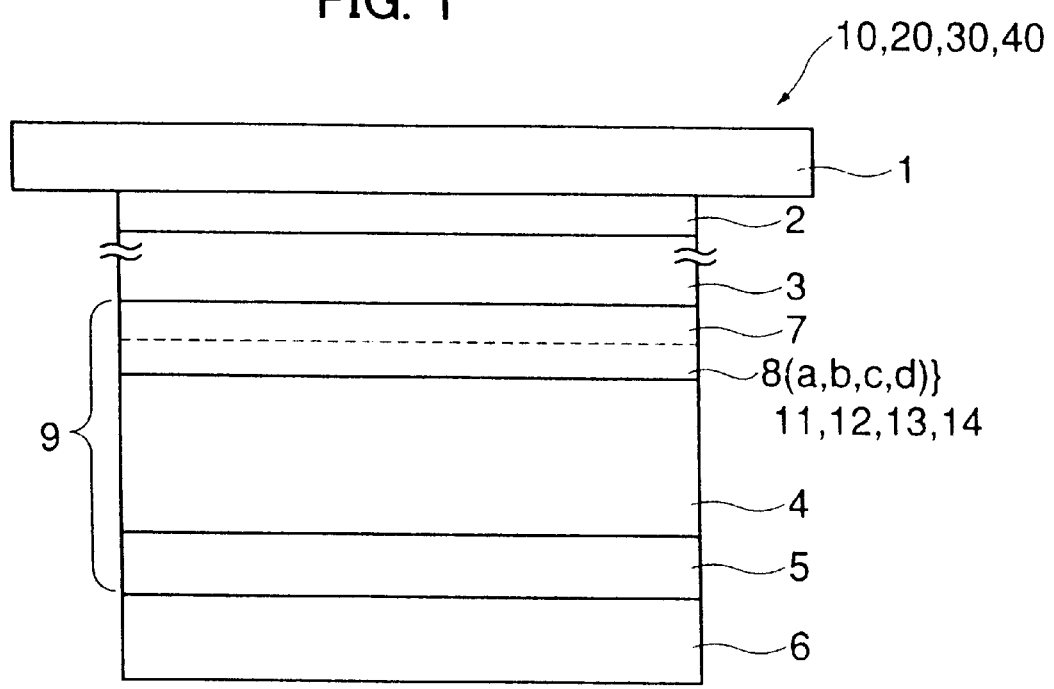
FIG. 1 is a schematic sectional view of major parts illustrating an embodiment of a tandem photoelectric conversion device according to the invention.

A photoelectric conversion device according to the invention primarily comprises a substrate, a front electrode layer, at least one pin junction layer serves as a photoelectric conversion layer and a back electrode layer, provided from the side of the device on which light is incident in the order listed. At least one of the pin junction layers comprises a p-layer including a first p-layer and a second p-layer as will be described later.

In the context of the invention, a photoelectric conversion device formed by stacking a plurality of pin junction layers between the above-mentioned two electrode layers is referred to as "tandem photoelectric conversion device", and a photoelectric conversion device formed by sandwiching one pin junction layer between the two electrode layers is referred to as "single-layered photoelectric conversion device". Not all of the plurality of pin junction layers of the tandem photoelectric conversion device are required to be a pin junction layer comprising a p-layer having the first and second p-layers as described above. It is however preferable that all of the pin junction layers include the first and second p-layers.

Any substrate may be used for the photoelectric conversion device according to the invention without any special limitation as long as it is normally used as a substrate of a solar battery cell. Various substrates may be used including metal substrates made of stainless steel, aluminum, copper and zinc, glass substrates, resin substrates made of polyimide, PET, PEN, PES and Teflon, resin-coated metal substrates and resin substrates with a metal layer formed thereon. Among them, transparent substrates are preferred. The substrate may form thereon an insulation film, another conductive film or wiring layer constituted by a metal or semiconductor, a buffer layer and the like or a combination of them, depending on the usage of the substrate. The thickness of the substrate is not particularly limited, but is set to, for example, about 0.1 to 30 mm to provide it with appropriate strength and weight. The substrate may have irregularities on the surface thereof.

The front electrode layer used in the photoelectric conversion device according to the invention may be a transparent conductive metal oxide such as ZnO, ITO, $SnO_2$ or the like. Since a film forming step in a reducing atmosphere is avoided as described later, ITO which is significantly deteriorated in a reducing atmosphere can be used in the device of the invention. Therefore, the effects of the invention are remarkable especially when ITO is used. Those electrode materials may be formed into a single layer or a plurality of layers. The thickness of the electrode may be, for example, about 200 to 2000 nm, although it may be appropriately adjusted depending on the material used and the like. The front electrode layer may be formed with irregularities on the front or back side thereof. For example, such irregularities may be similar to the wavelength of light in the visible range, i.e., they may be about 0.1 to 1.2 $\mu$m in height and have pitches of about 0.1 to 10 $\mu$m.

The p-layer of the tandem photoelectric conversion device may be provided by forming a first p-layer on a front electrode layer or on the n-layer of a pin junction layer stacked on a front electrode layer and forming a second p-layer thereon. In the case of the single-layered photoelectric conversion device, it may be provided by forming a first p-layer on the transparent electrode layer and then forming thereon a second p-layer.

The first p-layer may be formed as an amorphous silicon layer having a thickness o f about 5 nm or less by a CVD process, More preferably, by a plasma CVD process in which no hydrogen gas is used and a material gas and a diluent gas which is constituted of at least one kind of inert gas are seused.

The material gas may be, for example, $SiH_4$, $SiF_4$, $SiH_2Cl_2$, $SiCl_4$ or $Si_2H_6$.

The diluent gas may be one kind of inert gas (Ar, He, Ne or Xe) or a mixture of two or more of them. The mixing ratio between the material gas and the diluent gas is, for example, about 1:1 to 1:10 in a ratio by volume. Specifically, the ratio may be appropriately adjusted depending on the size of the film forming apparatus used and may be about 10 sccm: 10 sccm to 10 sccm: 100 sccm.

The mixture of the material gas and the diluent gas may be further mixed with an oxidizing gas. The oxidizing gas may be one kind of oxygen-containing gas, e.g., oxygen gas, carbon monoxide gas, carbon dioxide gas or ozone, or may be a mixture of two or more of them. The amount of the oxidizing gas used may be 0.001 to 1.0% by volume of the material gas, preferably of SiHi gas.

The scope of the present invention covers the formation of the first p-layer adjacent to the n-layer or the first p-layer adjacent to the front electrode layer in the tandem photoelectric conversion device using a known method, e.g., a CVD process or a plasma CVD process utilizing a gas, e.g., $SiH_4$, $GeH_4$, $H_2$, Ar or He.

However, it is preferable to form the first p-layer adjacent to the n-layer or the first p-layer adjacent to the front electrode layer as an amorphous silicon layer having a thickness of 5 nm or less like the first p-layer of the single-layered photoelectric conversion device as described above using a CVD process, more preferably, a plasma CVD process in which no hydrogen gas is used and only the material gas and the diluent gas constituted by at least one kind of inert gas are used.

P-type impurities (boron or the like) for forming the p-layer may be doped simultaneously with the formation of the p-layer by mixing, for example, $B_2H_6$ gas into the material gas. Alternatively, the doping may be performed by ion implantation, thermal diffusion or the like after forming the amorphous silicon layer. This makes it possible to dope the first p-layer with the p-type impurities uniformly. The first p-layer uniformly doped with impurities is in a state in which carriers, e.g., acceptors like boron exist throughout the first p-layer with a carrier density which satisfies a requirement that one carrier should exist for about 10000 Si atoms.

The thickness of 5 nm or less of the first p-layer is a thickness with which the amount of optical absorption of the first p-layer is within a negligible range, and this layer may be a film having one atomic layer of silicon. This layer preferably has a uniform thickness in the entire area thereof, but they may be formed, for example, into islands on the surface of the light-transmissive metal oxide layer.

After the first p-layer is formed, the surface thereof may be irradiated with plasma. The plasma used at this time may be generated using one kind of inert gas or a mixture of two or more kinds of inert gases, hydrogen gas, one kind of oxidizing gas or a mixture of two or more kinds of oxidizing gases, a mixture of two or more of those gases, e.g., a mixture of a hydrogen gas and an oxidizing gas (e.g., in a ratio by volume of 1:0.001 to 1:5.0) or the like. There is no limitation on conditions for plasma irradiation, but for example, it may be carried out using a high frequency power source of about 1 kHz to 13.56 MHz for duration of about 10 to 1000 seconds at power in the range from about 10 to 1000 W.

Such a plasma process makes it possible to increase the light absorption coefficient of the first p-layer, i.e., to suppress increase in the amount of light absorbed in the first p-layer, and this provides a relatively high short-circuit current.

Next, a second p-layer is formed on the first p-layer. The closer to an i-layer, the smaller number of p-type impurities the second p-layer has. The second p-layer may be formed by the same method as that for the formation of the first p-layer except that a material gas containing no p-type impurities is decomposed by electric discharge. The second p-layer may be formed using an inert gas as a diluent gas as done for the first p-layer, and a mixed gas obtained by adding an oxidizing gas to a material gas may be used. While it is preferable to use a gas with no hydrogen gas added as a diluent gas, it is not essential to use the gas without hydrogen gas.

According to the film formation method, the p-type impurities are not actively introduced but diffused from the underlying first p-layer. This consequently makes it possible to form a second p-layer which has a p-type impurity concentration similar to that of the first p-layer on the side thereof near the first p-layer and in which the closer to the i-layer, the lower the p-type impurity concentration becomes.

Further, a plasma process is preferably performed on the surface of the second p-layer every time it is deposited to a predetermined thickness and/or on the surface of the complete second p-layer. The plasma process may be performed on all or some of the surfaces of the plurality of the second p-layers. The plasma process performed at this time may be the same as that performed on the surface of the first p-layer. It is especially preferable to use plasma of a mixture of a hydrogen gas and an oxidizing gas (for example, in a ratio by volume of 1:0.001 to 1:5.0) or the like. There is no limitation on conditions for plasma irradiation, but for example, it may be adequately carried out using a high frequency power source of about 1 kHz to 1 MHz for duration in the range from about 10 to 1000 seconds at power of about 10 to 1000 W. The predetermined thickness may be, for example, 1 to 30 nm.

When the plasma process is performed each time the second p-layer reached the predetermined thickness, at least one of the frequency, irradiation time and power is preferably decreased sequentially. Such a plasma process makes it possible to gradually increase the light absorption coefficient of the second p-layer as it is closer to the i-layer, i.e., to gradually suppress increase of the amount of light absorbed in the first p-layer. As a result, the short-circuit current can be improved, and reduction of Voc and F. F. can be suppressed. For example, the above-described conditions for the plasma process may be set as shown in Table 1.

TABLE 1

| Gas Type | Gas Flow Rate | Processing Pressure (torr) | Applied Power (W) | Processing Time (min.) |
|---|---|---|---|---|
| $H_2$ | 100 | 0.8 | 200 | 10 |
| Ar | 100 | 0.6 | 100 | 5 |
| He | 100 | 1.0 | 100 | 10 |

The second p-layer may be formed with the same film forming apparatus as that used for the formation of the first p-layer, e.g., in the same chamber as that of a plasma CVD apparatus. In this case, the p-type impurities existing in the atmosphere used for the formation of the first p-layer may be introduced without designing any special doping profile. Consequently, there is formed the second p-layer with a certain doping profile which decreases the light absorption coefficient. That is, increase in the amount of light absorbed in the first and second p-layers can be suppressed. Workability is also improved. As a result, a reduction in the manufacturing costs can be achieved.

It is not essential to form the second p-layer in the same chamber of a film forming apparatus as that used for the formation of the first p-layer, and it may be formed in a different chamber. In this case, since no excessive diffusion of impurities occurs in the second p-layer, an internal electric field of the second p-layer can be easily controlled.

With the above-described structure of the p-layer, it is possible to suppress deterioration of the quality of the p-layer due to attraction of hydrogen by impurities while maintaining preferable characteristics of the interface between the p-layer and the light-transmissive metal oxide layer formed thereunder.

Further, a sufficient internal electric field can be generated in the i-layer which will be described later. This makes it possible to maintain a relatively high open-circuit voltage, thereby to suppress increase in the amount of light absorption. As a result, a relatively high short-circuit current can be obtained.

In the tandem photoelectric conversion device, the first p-layer and the second p-layer are preferably formed not only as the p-layer adjacent to the n-layer but also as the p-layer adjacent to the surface electrode layer.

There is no special limitation on the i-layer and the n-layer of the photoelectric conversion device according to the invention provided that they are an i-layer and an n-layer which are normally used in a pin junction layer of a photoelectric conversion device. For example, both of the i-layer and the n-layer may be constituted of an amorphous layer as described above. The i-layer may be a layer in which no impurity to serve as carriers is introduced. The n-layer may be a layer in which impurities to serve as donors, e.g., phosphorous, arsenic or the like are introduced in a quantity of about $10^{18}$ to $10^{19}$ atoms/cm$^{-3}$. The thickness of those layers may be appropriately adjusted depending on the energy to be provided by the photoelectric conversion device and the impurity concentrations of the p-layer, n-layer and the like. For example, the i-layer may have a thickness of about 100 to 600 nm, and the n-layer may have a thickness of about 30 to 100 nm. The i-layer is preferably formed in a chamber different from the chamber of a film forming apparatus in which the p-layer is formed. The reason is that entry of p-type impurities into the i-layer can be prevented.

There is no special limitation on the back electrode layer as long as it is made of a conductive material used for normal electrodes and, for example, the material may be a metal such as gold, platinum, silver, copper or aluminum or the light-transmissive metal oxide as described above. An appropriate thickness of this layer may suitably be chosen depending on the usage of the photoelectric conversion device.

The photoelectric conversion device according to the invention may have only one pin junction layer on the substrate or may alternatively have a plurality of pin junction layers which are arranged or stacked in parallel or in series with each other in a repetitive pattern. Not all of the n-, i- and p-layers that constitute the pin junction layer are required to be formed of an amorphous silicon layer. In addition, buffer layers, intermediate layers, conductive layers, insulation layers and the like may optionally be provided between the front electrode layer, p-layer, i-layer, n-layer and back electrode layer.

In the tandem photoelectric conversion device according to the invention, the p-layer adjacent to the n-layer is formed using only an a-Si film instead of an a-SiC film doped with boron. This improves the interface characteristics at the interfaces of the p-layer with the n-layer and with the i-layer both adjacent thereto, thereby to suppress increase in the amount of light absorption in the p-layer and allow preferable ohmic contact between the layers.

Embodiments of the tandem and the single-layered photoelectric conversion devices according to the invention will now be separately described with reference to the drawings.

FIG. 1 shows a specific sectional structure of the tandem photoelectric conversion device according to the invention.

In the tandem photoelectric conversion device, a transparent front electrode layer 2, a first pin junction layer 3, a second pin junction layer 9 and a back electrode layer 6 are formed in the order listed on a transparent glass substrate 1. The second pin junction layer 9 is constituted of p-layers 11, 12, 13 and 14, an i-layer 4 and an n-layer 5. Each of the p-layers 11 through 14 is formed of a first p-layer 7 constituted of a heavily doped p-type a-Si layer and second p-layers 8a through 8d constituted of p-type a-Si layers.

The first pin junction layer 3 is formed as a single pin junction by stacking p-, i- and n-layers on one another. It constitutes tandem photoelectric conversion devices 10, 20, 30 and 40 in combination with the above-described second pin junction layer 9 formed of the p-layers 11 through 14, the i-layer 4 and the n-layer 5. The first pin junction layer 3 formed of the p-, i- and n-layers may be provided by a method of manufacture different from that for the second pin junction layer 9.

A method for manufacturing the tandem photoelectric conversion device according to the invention will now be described with reference to four embodiments. While the description will particularly refer to doped layers made of Si as an primary element, it will be the same with respect to doped layers of amorphous silicon containing Ge such as a-SiGe:H films.

EMBODIMENT 1

In the present embodiment, as shown in FIG. 1, a tandem photoelectric conversion device 10 is provided by forming a transparent electrode layer 2, a first pin junction layer 3, a p-layer 11, an i-layer 4 and an n-layer 5 that comprise a second pin junction layer 9 and a back electrode layer 6 in the order listed on a transparent glass substrate 1. In this example, the p-layer 11 is constituted of a first p-layer 7 and a second p-layer 8a. A method for manufacturing the tandem photoelectric conversion device 10 will be described below.

First, an uneven transparent glass substrate 1 with a transparent electrode layer 2 made of ZnO was placed on a substrate supporting body in a p-layer forming chamber of a plasma gas phase film forming apparatus, and a first pin junction layer 3 was fabricated on the substrate 1.

A gas of $SiH_4:CH_4:B_2H_6=1:1:0.02$ was supplied at a flow rate of 200 sccm, and power of 200 W was applied to form a heavily boron-doped a-SiC layer. A non-doped a-SiC film was formed on this p-type doped a-SiC film to a thickness of 10 nm, and an i-layer of 100 nm thick formed in an i-layer forming chamber and an n-layer of 30 nm thick formed in an n-layer forming chamber were stacked thereon to fabricate a first pin junction layer 3. A material gas of $SiH_4:B_2H_6:H_2=1:0.1:20$ was supplied onto the pin junction layer 3 at a flow rate of 200 sccm. At this time, the film formation was performed at a film forming temperature of 200° C. and applied power of 200 W for one minute to fabricate a heavily doped p-type a-Si layer doped with boron at a high concentration which serves as a first p-layer 7. The thickness of the resulting heavily doped p-type a-Si layer was set at a value with which the amount of light absorption can be neglected (about 3 nm in this embodiment).

The growing time was set at a duration which allows sufficient amount of boron to enter the underlying n-layer so that preferable ohmic contact with the upper layer is obtained (about one minute as described above).

Subsequently, an a-Si layer with a thickness of about 10 nm which was not doped with boron was formed using a material gas of $SiH_4:H_2=100:200$ sccm in the same chamber. At this time, the entire a-Si layer was p-doped and changed into a second p-layer 8a because of boron diffused from the heavily doped p-type a-Si layer under the a-Si layer, i.e., the first p-layer 7, or boron entered from the atmospheric gas.

Next, an i-layer 4 having a thickness of about 200 nm was formed on a p-layer (p-type amorphous silicon layer) 11 which comprises a stack of the first p-layer 7 and the second p-layer 8a in the i-layer forming chamber using a material gas of $SiH_4:H_2=200:500$ sccm at applied power of 100 W. Further, an n-layer 5 having a thickness of about 30 nm was formed on the i-layer 4 in the n-layer forming chamber using a material gas of $SiH_4:H_2:PH_3=10:500:3$ at applied power of 100 W, thereby forming a second pin junction layer 9. Next, an Ag film having a thickness of about 500 nm was formed on the n-layer 5 of the second pin junction layer 9 using a sputtering apparatus at a film formation temperature of 200° C., thereby to form a back electrode layer 6. Thus, the tandem photoelectric conversion device 10 was fabricated.

EMBODIMENT 2

In the present embodiment, as shown I FIG. 1, a tandem photoelectric conversion device 20 is provided by forming a transparent electrode layer 2, a first pin junction layer 3, a p-layer 12, an i-layer 4 and an n-layer 5 that comprises a second pin junction layer 9 and a back electrode layer 6 in the order listed on a transparent glass substrate 1. In this example, the p-layer 12 is formed of a first p-layer 7 and a second p-layer 8b, and the second p-layer 8b is formed by a method of manufacture in which a plasma process is performed on the surface of the second p-layer 8b every time it is deposited to a predetermined thickness.

A method for manufacturing the tandem photoelectric conversion device 20 will be described below.

First, an uneven transparent glass substrate 1 with a transparent electrode layer 2 made of ZnO was placed on a substrate supporting body in a p-layer forming chamber of a plasma gas phase film forming apparatus, and a pin junction layer 3 constituted of an a-Si layer was fabricated on the substrate 1. A material gas of $SiH_4:B_2H_6:H_2=1:0.1:20$ was supplied at a flow rate of 200 sccm onto the n-layer of the pin junction layer 3. At this time, film formation was performed at a film forming temperature of 200° C. and applied power of 200 W for one minute to fabricate a heavily doped p-type a-Si layer doped with boron at a high concentration which serves as a first p-layer 7. The thickness of the resulting heavily doped p-type a-Si layer was set at a value with which the amount of light absorption was negligible (about 3 nm in this embodiment).

Subsequently, an a-Si layer with a thickness of about 10 nm which was not doped with boron was formed using a material gas of $SiH_4:H_2=100:200$ sccm in the same chamber. At this time, the entire a-Si layer was p-doped and changed into a second p-layer 8b because of boron diffused from the heavily doped p-type a-Si layer under the a-Si layer, i.e., the first p-layer 7, or boron entered from the atmospheric gas.

In this example, at the formation of the second p-layer having a thickness of about 10 nm, an $H_2$ plasma process was performed each time an a-Si layer of 3 nm thick was formed on the first p-layer 7, in order to reduce light absorption loss in the second p-layer 8b.

Next, an i-layer 4 and an n-layer 5 were stacked on a p-layer 12 thus formed similarly to the case of the above-described photoelectric conversion device 10 to form a second pin junction layer 9. Then, a back electrode layer 6 was formed on the n-layer 5 of the second pin junction layer 9 to complete a tandem photoelectric conversion device 20.

EMBODIMENT 3

In the present embodiment, as shown I FIG. 1, a tandem photoelectric conversion device 30 is provided by forming a transparent electrode layer 2, a first pin junction layer 3, a p-layer 13, an i-layer 4 and an n-layer 5 that comprise a second pin junction layer 9 and a back electrode layer 6 in the order listed on a transparent glass substrate 1. In this example, the p-layer 13 is formed of a first p-layer 7 and a second p-layer 8c. The second p-layer 8c is formed by a method of manufacture in which a plasma process is performed on the surface of the second p-layer 8c for a plasma irradiation time and/or with reduced processing power each time the second p-layer 8c of a predetermined thickness is obtained.

A method for manufacturing the tandem photoelectric conversion device 30 will be described below.

First, an uneven transparent glass substrate 1 with a transparent electrode layer 2 made of ZnO was placed on a substrate supporting body in a p-layer forming chamber of a plasma gas phase film forming apparatus, and a pin junction layer 3 constituted of an a-Si layer was fabricated on the substrate 1. A material gas of $SiH_4:B_2H_6:H_2=1:0.1:20$ was supplied at a flow rate of 200 sccm onto the n-layer of the pin junction layer 3. At this time, the film formation was performed at a film forming temperature of 200° C., a substrate temperature of 200° C. and applied power of 200 W for one minute to fabricate a heavily doped p-type a-Si layer doped with boron at a high concentration which serves as a first p-layer 7. The thickness of the resulting heavily doped p-type a-Si layer was set at a value at which the amount of light absorption can be neglected (about 3 nm in this embodiment).

Subsequently, an a-Si layer with a thickness of about 10 nm which was not doped with boron was formed using a material gas of $SiH_4:H_2=100:200$ sccm in the same chamber. At this time, the entire a-Si layer was p-doped and changed into a second p-layer 8c because of boron diffused from the heavily doped p-type a-Si layer under the a-Si layer, i.e., the first p-layer 7, or boron entered from the atmospheric gas.

In this example, when the second p-layer having a thickness of about 10 nm was formed, an $H_2$ plasma process was performed each time an a-Si layer of 3 nm thick was formed on the first p-layer 7 at reduced applied power for five minutes in order to reduce light absorption loss in the second p-layer 8c. Specifically, an a-Si layer was formed to a thickness of about 3 nm on the first p-layer 7; the $H_2$ plasma process was performed to irradiate it at applied power of 300 W for five minutes; another a-Si film was then formed to a thickness of about 3 nm; the $H_2$ plasma process was performed to irradiate it at applied power of 200 W for five minutes; still another a-Si layer was then formed to a thickness of about 3 nm; and the $H_2$ plasma process was performed to irradiate it at applied power of 100 W for five minutes. A second p-layer 8c having a thickness of about 10 nm was thus formed.

As described above, an i-layer 4 and an n-layer 5 were stacked on the p-layer 13 thus formed to form a second pin junction layer 9. Then, a back electrode layer 6 was formed on the n-layer 5 of the second pin junction layer 9 to complete a tandem photoelectric conversion device 30.

In the present example, the plasma process was performed with the plasma irradiation time kept coefficient and the processing power reduced gradually. However, the plasma irradiation time may be gradually decreased while the processing power kept constant and, alternatively, both of the plasma irradiation time and processing power may be gradually reduced.

EMBODIMENT 4

In the present embodiment, as shown I FIG. 1, a tandem photoelectric conversion device 40 is provided by forming a transparent electrode layer 2, a first pin junction layer 3, a p-layer 14, an i-layer 4 and an n-layer 5 that comprise a second pin junction layer 9 and a back electrode layer 6 in the order listed on a transparent glass substrate 1. In this example, the player 14 is formed of a first p-layer 7 and a second p-layer 8d. The second p-layer 8d is formed by a method of manufacture in which a plasma process is performed on the surface of the first p-layer 7 after the first p-layer 7 is formed.

A method for manufacturing the tandem photoelectric conversion device 40 will be described below.

First, an uneven transparent glass substrate 1 with a transparent electrode layer 2 made of ZnO was placed on a substrate supporting body in a p-layer forming chamber of a plasma gas phase film forming apparatus, and a pin junction layer 3 made of a-Si was fabricated on the substrate 1. A material gas of $SiH_4:B_2H_6:H_2=1:0.1:20$ was supplied at a flow rate of 200 sccm onto the n-layer of the pin junction layer 3. At this time, the film formation was performed at a film forming temperature of 200° C., a substrate temperature of 200° C. and applied power of 200 W for one minute to fabricate a heavily doped p-type a-Si layer doped with boron at a high concentration which serves as a first p-layer 7. The thickness of the resulting heavily doped p-type a-Si layer was set at a value with which the amount of light absorption can be neglected (about 3 nm in this embodiment).

Subsequently, a plasma process was performed on the surface of the first p-layer 7 using $H_2$ gas in the same chamber under the conditions shown in Table 1. Then, an a-Si layer with a thickness of about 10 nm which was not doped with boron was formed using a material gas of $SiH_4:H_2=100:200$ sccm in the same chamber. At this time, the entire a-Si layer was p-doped and changed into a second p-layer 8d because of boron diffused from the heavily doped p-type a-Si layer under the a-Si layer, i.e., the first p-layer 7, or boron entered from the atmospheric gas.

An i-layer 4 and an n-layer 5 were formed on the p-layer 14 thus formed to form a second pin junction layer 9. Then, a back electrode layer 6 was formed on the n-layer 5 of the second pin junction layer 9 to complete a tandem photoelectric conversion device 40.

Comparative Test

In addition to the tandem photoelectric conversion devices 10, 20, 30 and 40, a tandem photoelectric conversion device according to the prior art was fabricated for the purpose of comparison. The prior art device comprises a second pin junction layer including a p-layer having conventional contact layers (a heavily doped p-type a-Si layer and p-type a-SiC layer) formed on a transparent substrate.

First, the formation of an a-SiC layer heavily doped with boron was carried out by supplying a gas of $SiH_4:CH_4:B_2H_6=1:1:0.02$ at a flow rate of 200 sccm and applying power of 200 W. A first pin junction layer was fabricated by stacking a non-doped a-SiC film with a thickness of 10 nm on the p-type doped a-SiC film and stacking thereon an i-layer with a thickness of 80 nm in an i-layer forming chamber and an n-layer with a thickness of 30 nm in an n-layer forming chamber. A heavily doped p-layer to serve as a recombination layer was formed on the n-layer to a thickness of 3 nm. Then an a-SiC layer heavily doped with boron was fabricated by supplying a gas of $SiH_4:CH_4:B_2H_6=1:1:0.02$ at a flow rate of 200 sccm and applying power of 200 W. A second pin junction layer was fabricated by stacking thereon a non-doped a-SiC film with a thickness of 10 nm on the p-type doped a-SiC film and stacking an i-layer with a thickness of 300 nm in the i-layer forming chamber and an n-layer with a thickness of 30 nm in the n-layer forming chamber. Thereafter, a back metal electrode layer 6 was fabricated by sputtering to complete a tandem photoelectric conversion device (pin junction layer cell 100).

Figure 2:
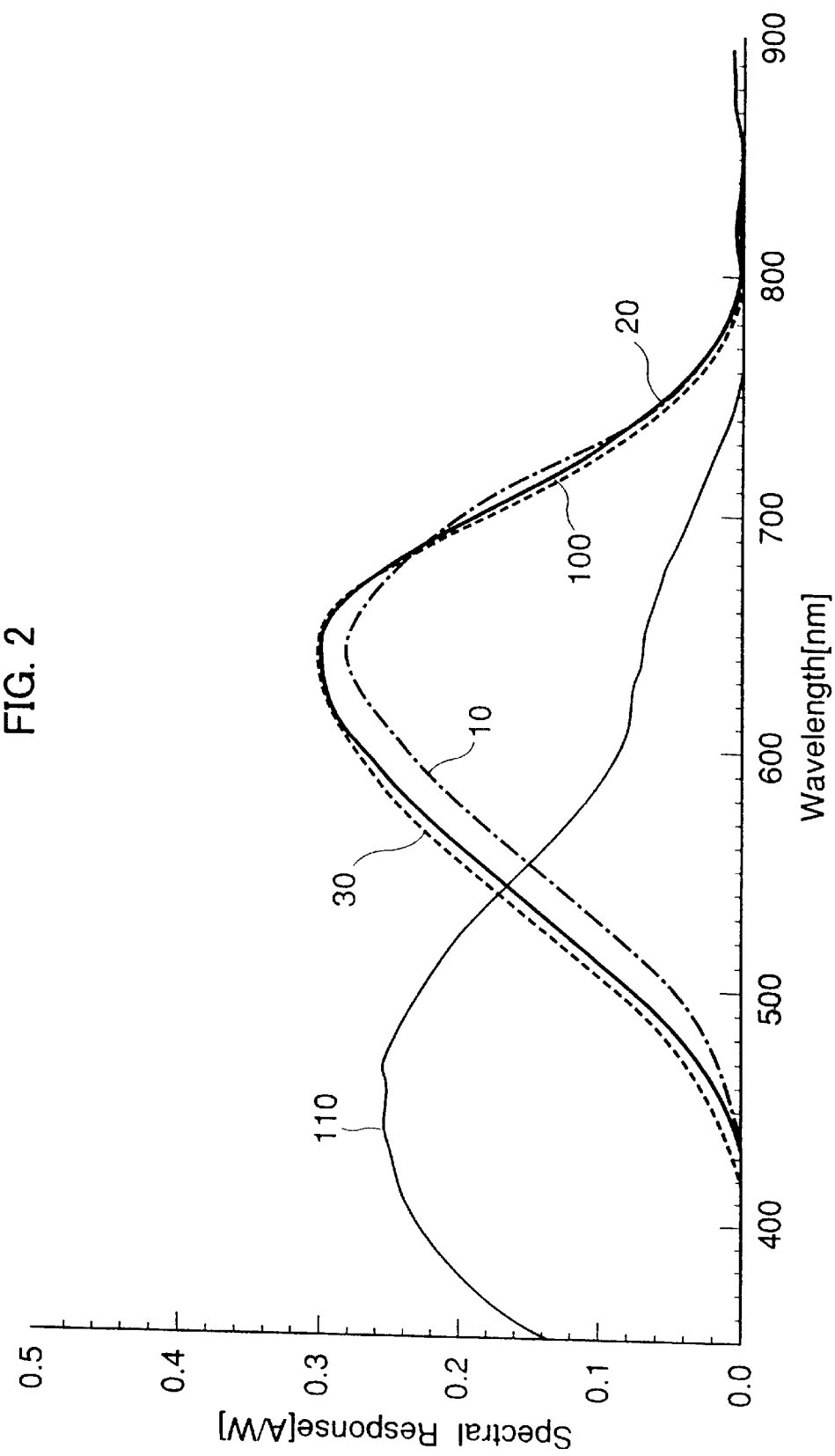
FIG. 2 is a graph illustrating a comparison of spectral response characteristics between a photoelectric conversion device according to the invention and a photoelectric conversion device according to the related art.

Measurement was performed on spectral response characteristics, i.e., spectral responses to wavelengths, of the tandem photoelectric conversion device according to the prior art and the above-described tandem photoelectric conversion devices 10, 20 and 30 according to the invention. FIG. 2 shows the results. Reference number 110 in FIG. 2 represents the characteristics of the adjacent first pin junction layer.

Referring to the photoelectric conversion device 30, it exhibited the spectral response characteristics equivalent to the response of the pin junction layer cell 100 according to the related art utilizing a p-type a-SiC layer in spite of the fact that no alloy film was used in the p-layer. Making the conditions for plasma processing less strict in accordance with the closeness to the i-layer suppresses adverse influence at the p-i interface, i.e., recombination at the interface. As a result thereof, F.F. of the device was improved by F.F.>0.74.

Figure 3:
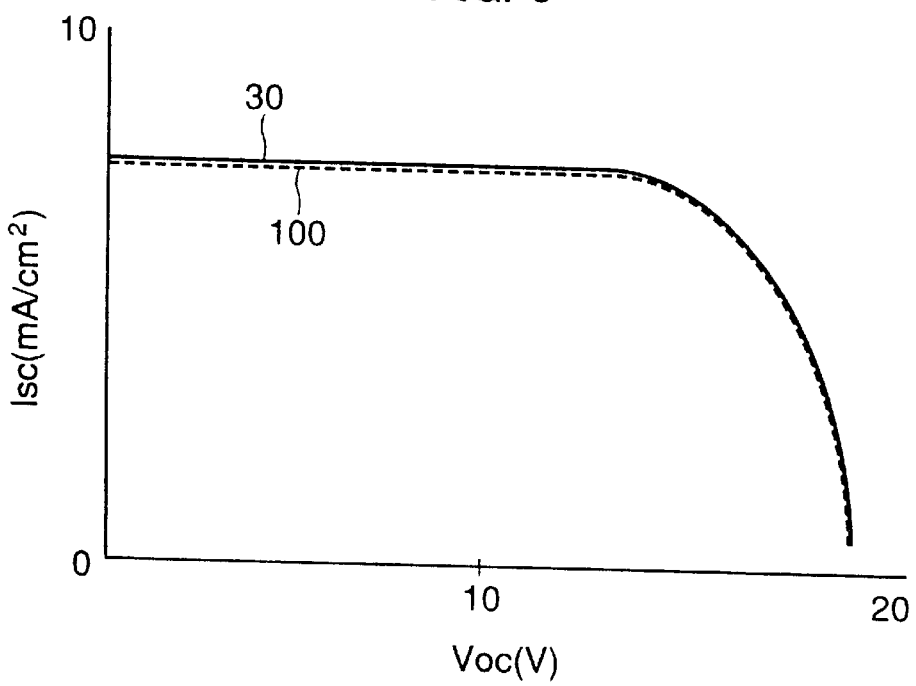
FIG. 3 is a graph illustrating I–V characteristics of the photoelectric conversion device shown in FIG. 1 and the photoelectric conversion device according to the related art.

Further, measurement was made on I–V characteristics, i.e., current versus voltage of the above-described tandem photoelectric conversion device according to the related art and the above-described tandem photoelectric conversion device 30 according to the invention. FIG. 3 shows the results.

As apparent from FIG. 3, in the tandem photoelectric conversion device 30 of Embodiment 3, a short-circuit current equivalent to or slightly higher than that in the pin junction layer cell 100 according to the related art utilizing a p-type a-SiC layer was obtained since the amount of light absorbed in the p-layer was small. As apparent from the Voc (open-circuit voltage), the p-layer had a sufficient carrier concentration.

Embodiments of single-layered photoelectric conversion devices according to the invention will now be described with reference to Table 2. Table 2 shows the conditions for measurement on a comparative test and Embodiments 5–13 to be described later and results of the measurement.

TABLE 2

|  | JsC (mA/cm$^2$) | Voc (V) | F.F. | Pmax (mW/cm$^2$) | Jsc/ Jsc0 | Voc/ Voc0 | F.F./ F.F.0 | Pmax/ Pmax0 |
| --- | --- | --- | --- | --- | --- | --- | --- | --- |
| COMPARATIVE EXAMPLE | 16.00 | 0.880 | 0.680 | 9.57 | 1.00 | 1.00 | 1.00 | 1.00 |
| EMBODIMENT 5 | 16.48 | 0.880 | 0.680 | 9.86 | 1.03 | 1.00 | 1.00 | 1.03 |
| EMBODIMENT 6 | 16.80 | 0.890 | 0.680 | 10.17 | 1.05 | 1.01 | 1.00 | 1.06 |
| EMBODIMENT 7 | 16.64 | 0.890 | 0.680 | 10.07 | 1.04 | 1.01 | 1.00 | 1.05 |
| EMBODIMENT 8 | 16.67 | 0.889 | 0.680 | 10.08 | 1.04 | 1.01 | 1.00 | 1.05 |
| EMBODIMENT 9 | 16.80 | 0.890 | 0.694 | 10.37 | 1.05 | 1.01 | 1.02 | 1.08 |
| EMBODIMENT 10 | 17.00 | 0.889 | 0.680 | 10.27 | 1.06 | 1.01 | 1.00 | 1.07 |
| EMBODIMENT 11 | 17.21 | 0.920 | 0.740 | 11.72 | 1.08 | 1.05 | 1.09 | 1.22 |
| EMBODIMENT 12 | 17.20 | 0.920 | 0.730 | 11.08 | 1.08 | 1.05 | 1.07 | 1.16 |
| EMBODIMENT 13 | 17.21 | 0.920 | 0.738 | 11.68 | 1.08 | 1.05 | 1.09 | 1.22 |

Comparative Test

Two kinds of heavily doped a-Si layers (first p-layer) were formed on a transparent glass substrate by supplying a mixed gas of $SiH_4/B_2H_6/H_2$ (or He)=1/0.1/20 at a rate of 200 sccm and applying power of 200 W using $H_2$ or lie as a diluent gas. Those layers were heavily doped a-Si films formed using a gas mixed with a small amount of $SiH_4$, and the thickness of them was set at a value with which the amount of light absorption was negligible. The thickness was set at 2 nm based on the film formation speed calculated from the time required for forming a single film with a thickness of 300 nm.

Thereafter, a diffusion-doped layer with a thickness of 10 nm (second p-layer) which was not doped with p-type impurities was formed in the same chamber, and the entire diffusion-doped layer was changed into a p-layer by diffusing boron into the layer from the underlying heavily doped layers.

Thereafter, those layers were formed repeatedly using $H_2$ or He as a diluent gas to form p-layers consisting of two layers having a thickness of 300 nm.

Figure 4:
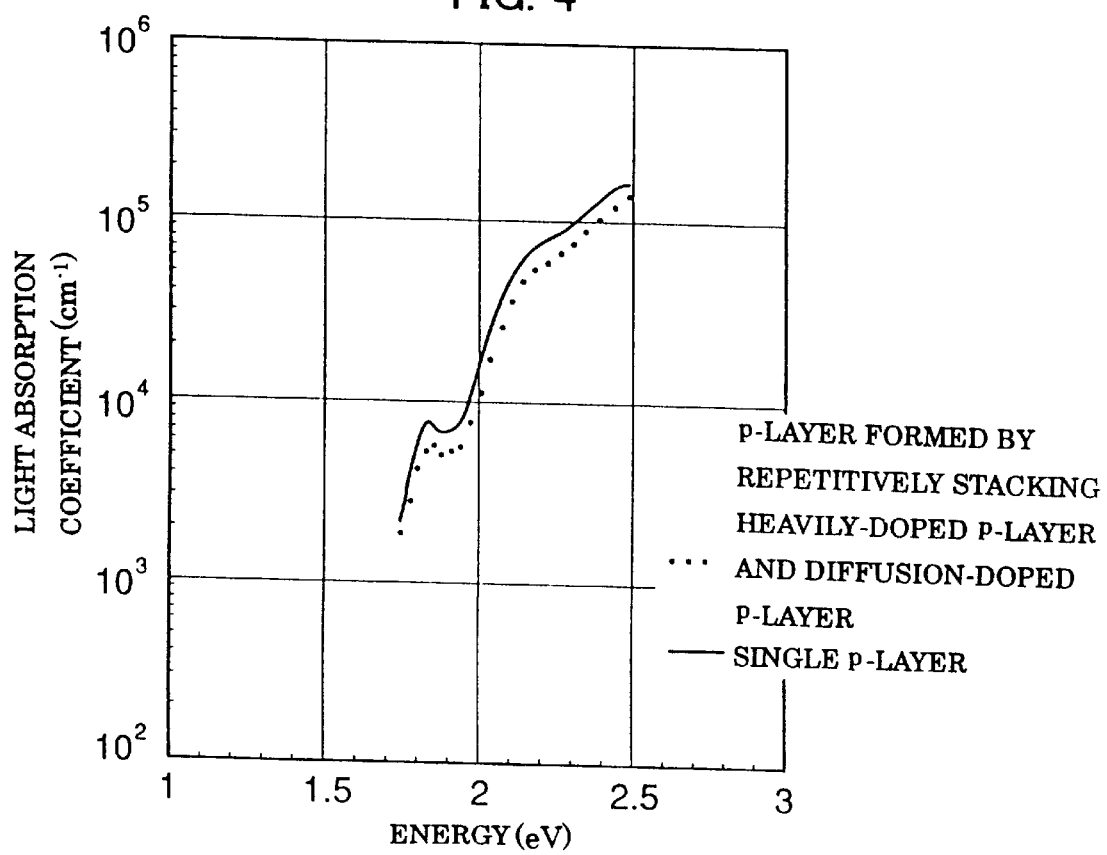
FIG. 4 is a graph illustrating the amount of light absorption of p-layers formed using a hydrogen gas and a helium gas as a diluent gas, respectively.

FIG. 4 shows the amount of light absorption of the resulting p-layer made of two layers in terms of a light absorption coefficient (solid line in FIG. 4). A single p-layer having no diffusion-doped layer (second p-layer) was formed with the same thickness as a comparative example, and the amount of light absorption of the same was measured in the same manner. The results are shown in FIG. 4 in terms of a light absorption coefficient (plotted in FIG. 4).

FIG. 4 shows that the p-layer having a multi-layer structure formed of a layer doped with p-type impurities and a non-doped layer absorbs a smaller amount of light compared with the p-layer having no diffusion-doped layer because no hydrogen attracting effect of boron occurs when the p-layer is formed. Further, since those p-layers had substantially the same conductivity of about $5 \times 10^{-4}$ S/cm, no difference between the light absorption coefficients of those layers attributable to the different diluent gases was observed. That is, FIG. 4 shows that the multi-layer structure formed of the first and the second p-layers exhibited a more preferable light absorption coefficient compared with the layer constituted of a doped layer only.

While a heavily boron-doped layer was formed stepwise by 10 nm thick in the above-described comparative test, it was revealed that the effect of reducing the amount of light absorption was achieved at a film formation temperature of 200° C. and with the same conductivity even when the film is deposited by a thickness of 30 nm or less.

EMBODIMENT 5

A $SnO_2$ layer was formed on a transparent glass substrate, and then two kinds of heavily doped a-Si layers (first p-layer) were formed to a thickness of 2 nm by supplying a mixed gas of $SiH_4/B_2H_6/H_2$ (or He)=1/0.1/20 at a rate of 200 sccm with $H_2$ or He diluent gas and applying power of 200 W.

Thereafter, a diffusion-doped layer with a thickness of 10 nm (second p-layer) which was not doped with p-type impurities was formed in the same chamber, and the entire diffusion-doped layer was changed into a p-layer by diffusing boron into the layer from the underlying heavily doped layers.

Figure 5:
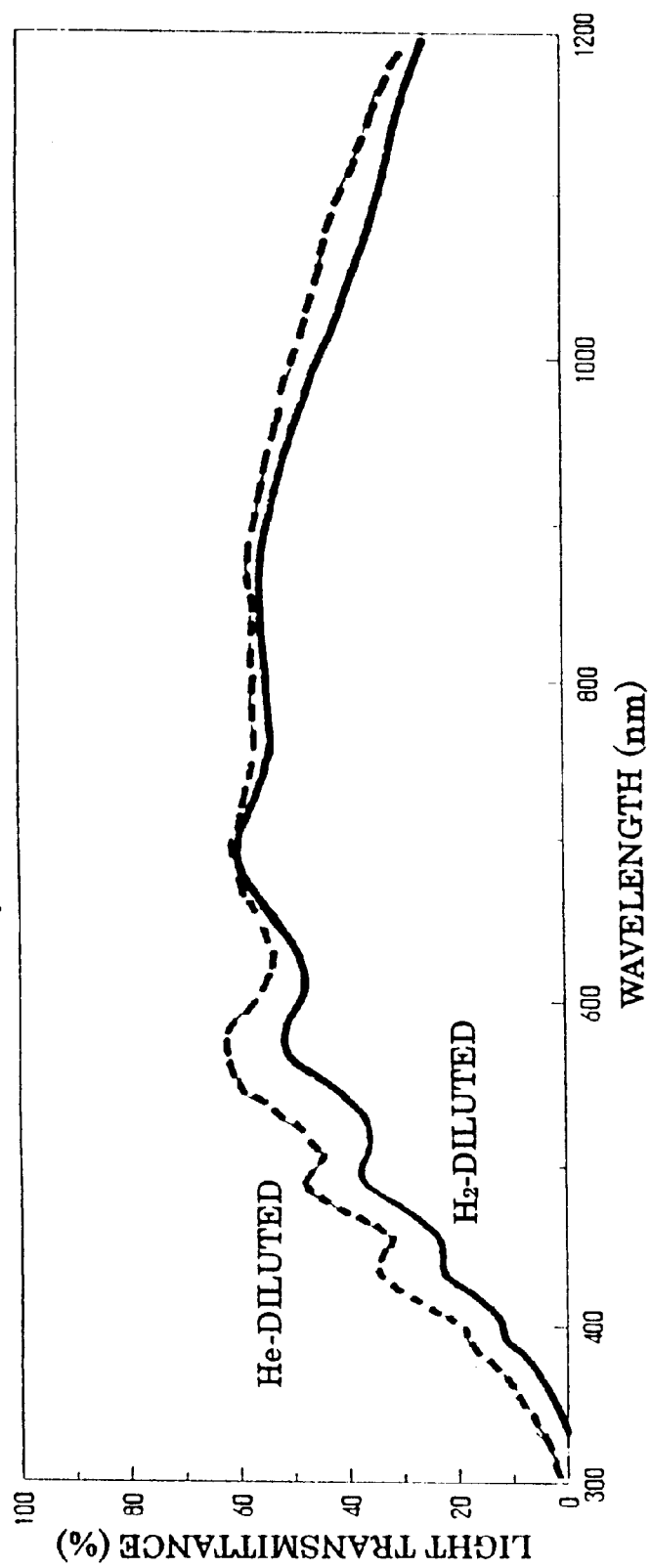
FIG. 5 is a graph illustrating light transmittance with a light-transmissive metal oxide layer and a p-layer formed on a light-transmissive substrate according to a method for manufacturing a photoelectric conversion device of the invention.

FIG. 5 shows the light transmittance of the resulting two kinds of substrates.

Although there is no difference in light absorption between the two p-layers themselves according to the results shown in FIG. 4, FIG. 5 shows that the light transmittance of the film formed with He diluent gas was greater than that of the film formed with $H_2$ diluent gas by 10% or more.

The result shows that the reduction and the darkening of the $SnO_2$ layer attributable to $H_2$ plasma were mitigated by dilution with only He excluding $H_2$.

Subsequently, a pin type photoelectric conversion device was fabricated by forming an i-layer of 200 nm thick on the resulting p-layer in an i-layer forming chamber, forming an n-layer of 30 nm thick in an n-layer forming chamber and forming a front electrode layer thereon. As shown in FIG. 7, this photoelectric conversion device has a structure in which a light-transmissive substrate 1, a light-transmissive metal oxide layer 2 as a front electrode layer, a first p-layer 7, a second p-layer 8, an i-layer 4, an n-layer 5 and a back electrode layer 6 are formed sequentially.

Measurement was made on the short-circuit current, open-circuit voltage, F.F. and conversion efficiency of the resulting pin device under A.M. 1.5 irradiation.

The same measurement was carried out also on the pin device according to Embodiment 1 obtained by forming a p-layer using a $H_2$-diluted gas as a material gas, and the result was shown in Table 2 as a comparative example. Table 2 also shows ratios of the open-circuit voltage, F.F. and conversion efficiency of the present embodiment to those of the comparative example.

EMBODIMENT 6

A p-layer and a pin device were formed in substantially the same manner as in Embodiment 5 except that the first p-layer was formed using a mixed gas of $SiH_4/B_2H_6/He/CO_2$=1/0.1/20/0.01 to 1.0.

A measurement on the light transmittance of the resulting substrate exhibited an improvement with a maximum value of 63%.

Since $CO_2$ was added in the amount similar to the added amount of $B_2H_6$, conductivity was $1 \times 10^4$ S/cm which is a sufficiently high value to serve as a window layer.

The results indicate that the addition of a very small amount of an oxidizing gas to the mixture of the material gas and the diluent gas mitigated the reduction and darkening of the $SnO_2$ layer attributable to $H_2$ plasma.

EMBODIMENT 7

After a first p-layer was formed in the same manner as in Embodiment 5, a plasma process was performed on the surface of the first p-layer for 100 seconds using a He gas at a frequency of 13.56 MHz and applied power of 100 W. Thereafter, a diffusion-doped layer with a thickness of 10 nm (second p-layer) which was not doped with p-type impurities was formed in the same chamber. The entire diffusion-doped layer was changed into a p-layer by diffusing boron into the layer from the underlying heavily doped layer, and a pin device was further fabricated.

A measurement of the amount of light absorption of the resulting first p-layer indicated that a further reduction of the light absorption coefficient was achieved in comparison with that in the case shown in FIG. 4 wherein He gas was used as a diluent gas.

It was revealed that a plasma process at a lower frequency was also effective. Specifically, since a plasma process at a frequency of 1 MHz can achieve a similar reduction in the light absorption coefficient, a reduction of processing time down to ¼ of that of the process at a frequency of 13.56 MHz can be achieved.

It was also revealed that the use of a frequency lower than 1 kHz results in deterioration of the device characteristics (F.F.) of the pin device because of damage to the film.

EMBODIMENT 8

A first p-layer, a second p-layer and a pin device were fabricated in substantially the same manner as in Embodiment 7 except that a plasma process was performed on the first p-layer using $H_2$ gas instead of an inert gas at a frequency of 10 kHz (applied power: 100 W, irradiation time: 10 seconds).

Since the $H_2$ plasma process at a frequency of 10 kHz (applied power: 100 W, irradiation time: 10 seconds) achieved a reduction in the light absorption coefficient similar to that achieved by the plasma process using an inert gas (at a frequency of 13.56 MHz), a reduction of processing time down to 1/10 of that of the process at a frequency of 13.56 MHz using an inert gas was achieved.

In addition, the $H_2$ plasma process at a frequency of 1 kHz or more did not cause any reduction of device characteristics (F.F.).

EMBODIMENT 9

A first p-layer, a second p-layer and a pin device were fabricated in substantially the same manner as in Embodiment 8 except that a mixture of hydrogen gas and $CO_2$ gas of 0.001 to 5.0% of the hydrogen gas was used for the first p-layer instead of hydrogen gas.

In this case, a further improvement of light transmittance by about 2% was achieved as compared with the case shown in FIG. 5 wherein He gas was used as a diluent gas.

This revealed that the plasma process utilizing the mixture of the hydrogen gas and the oxidizing gas could further improve the light transmittance of the p-layer.

EMBODIMENT 10

After a first p-layer was formed in the same manner as in Embodiment 1, a second p-layer was formed thereon by performing a plasma process utilizing a mixture of a hydrogen gas and a $CO_2$ gas of 0.001 to 5.0% of the hydrogen gas similarly to Embodiment 9.

The surface of the resulting second p-layer was irradiated with plasma for 100 seconds utilizing a mixture of a hydrogen gas and a $CO_2$ gas of 0.001 to 1.0% of the hydrogen gas at a frequency of 13.56 MHz and applied power of 100 W.

As a result, the light transmittance of the resulting substrate was further improved by about 1% as compared with that in Embodiment 9.

Figure 6:
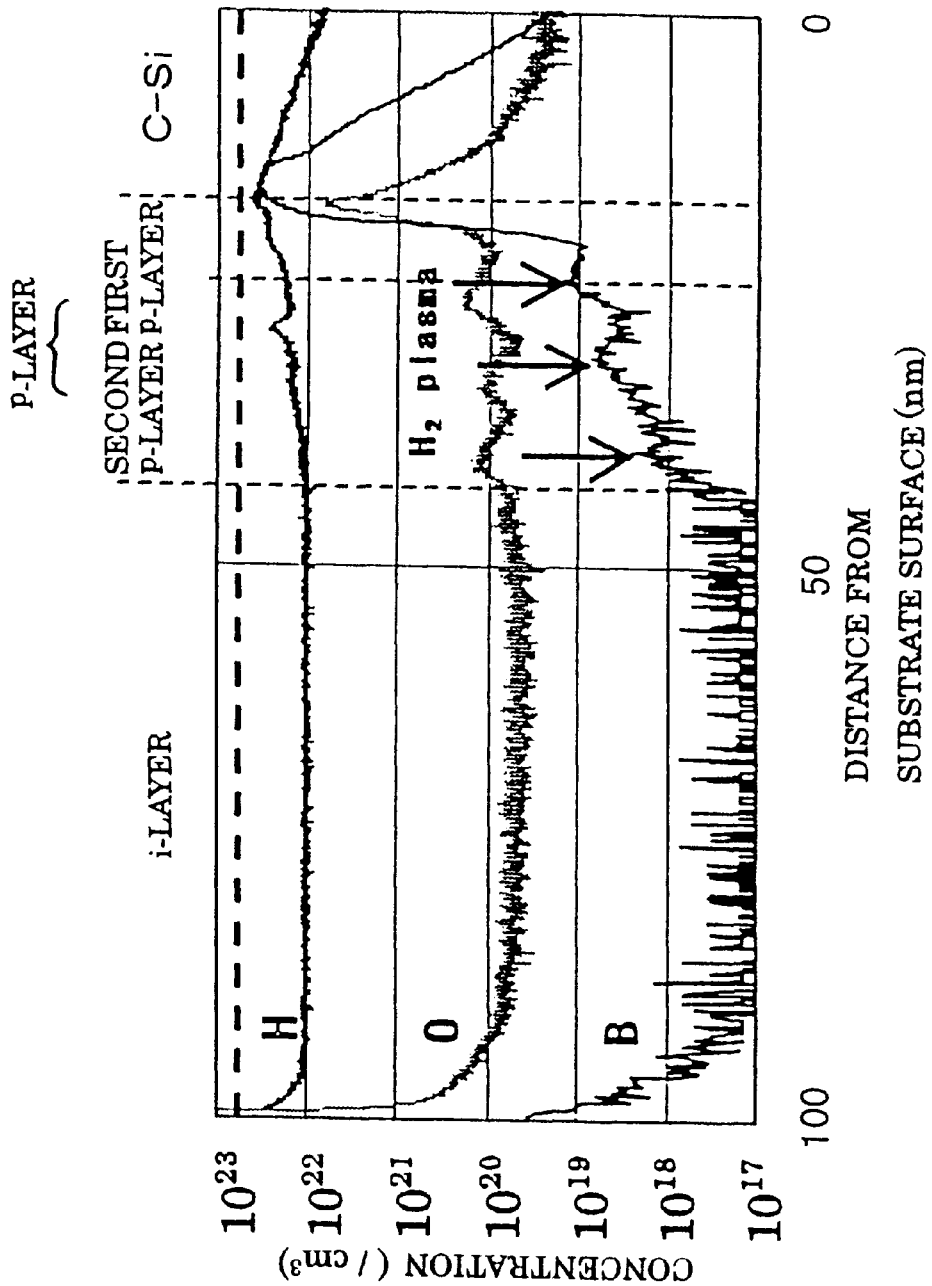
FIG. 6 is a graph illustrating densities of H, O and B in a p-layer comprising a first p-layer and a second p-layer irradiated with plasma of a hydrogen gas.

When the second p-layer is subjected to a plasma process utilizing a $H_2$ gas, boron that has been deposited on the cathode during the formation of the first p-layer may possibly enter the second p-layer through the hydrogen plasma as shown in FIG. 6. When the surface of the second p-layer is irradiated with plasma of the mixture of the hydrogen gas and the oxidizing gas as in the present embodiment, the reduction of the second p-layer attributable to boron radicals generated during the formation of the layer can be suppressed to consequently improve the light transmittance of the p-layer.

EMBODIMENT 11

A heavily doped a-Si layer having a thickness of 2 nm was formed as a first p-layer by supplying a mixed gas of $SiH_4/B_2H_6/He=1/0.1/20$ at a flow rate of 200 sccm onto a glass/$SnO_2$ substrate having irregularities and applying power of 200 W.

Thereafter, a plasma process was performed on the surface of the first p-layer for an irradiation time of 100 seconds using a mixture of a hydrogen gas and a $CO_2$ gas of 0.001 to 5.0% of the hydrogen gas at a frequency of 13.56 MHz and applied power of 100 W.

Subsequently, a second p-layer of 3 nm thick was formed on the resulting first p-layer in the same film forming chamber, and a $H_2$ plasma process was performed at a frequency of 300 kHz and applied power of 50 W for 30 seconds. Further, another second p-layer of 3 nm thick was formed, and a $H_2$ plasma process was performed at a frequency of 10 kHz and applied power of 50 W for 30 seconds.

Then, an i-layer of 200 nm thick was formed in an i-layer forming chamber and an n-layer of 30 nm thick was formed in an n-layer forming chamber to fabricate a pin type photoelectric conversion device, and measurement was made on the short-circuit current, open-circuit voltage, F.F. and conversion efficiency.

EMBODIMENT 12

A second p-layer of 3 nm thick was formed on a first p-layer which had been plasma-processed in the same manner as in Embodiment 10 and was subjected to a $H_2$ plasma process for five minutes at a frequency of 13.56 MHz and applied power of 50 W. Further, another second p-layer of 3 nm thick was formed thereon and still another second p-layer was formed in a p-layer forming chamber, and then a $H_2$ plasma process was performed for five minutes at a frequency of 13.56 MHz and applied power of 50 W. After forming a plurality of second p-layers in such a manner, an i-layer of 200 nm thick was formed in an i-layer forming chamber and an n-layer of 30 nm thick was formed in an n-layer forming chamber as described above, thereby to form a pin type photoelectric conversion device. As shown in FIG. 8, this pin device has a structure in which a light-transmissive substrate 1, a light-transmissive metal oxide layer 2, a first p-layer 7, second p-layers 8a and 8b, an i-layer 4, an n-layer 5 and a metal electrode 6 are formed sequentially.

According to the present embodiment, the amount of light absorption of the second p-layers was reduced as compared with Embodiment 7, resulting in improvement of the short-circuit current by 2% and F.F. by about 2%.

EMBODIMENT 13

A second p-layer of 3 nm thick was formed on first p-layer which had been a plasma-processed in the same manner as in Embodiment 7, and was subjected to a $H_2$ plasma process for five minutes at a frequency of 13.56 MHz and applied power of 50 W. Further, another second p-layer of 3 nm thick was formed and was subjected to a $H_2$ plasma process for five minutes at a frequency of 13.56 MHz and applied power of 20 W. Thereafter, a 200 nm thick i-layer and a 30 nm thick n-layer were formed in the same manner as described above to fabricate a pin type photoelectric conversion device. The short-circuit current, open-circuit voltage, F.F. and conversion efficiency were measured.

The results shown in Table 2 indicate that the short-circuit current of the pin device of the above embodiment under A.M. 1.5 irradiation was improved with a maximum of 6% as compared with the device of a comparative example which was formed using a $H_2$ gas as a diluent gas. The device exhibited an open-circuit voltage and F.F. equal to or better than the comparative example.

It was further revealed that F.F. is improved to 0.74 and the short-circuit current is improved to 17.21 mA/cm$^2$ in a device having second p-layers fabricated using plasma irradiation at a low frequency which is gradually decreased as in Embodiment 11. Further, in the case of a device having second p-layers fabricated using plasma irradiation at gradually decreased power as in Embodiment 13, improved alignment at the p-i interface was obtained, so that the open-circuit voltage was improved to 0.92 V, the F.F. to 0.738 and the short-circuit current to 17.21 mA/cm$^2$ even when the device was processed at 13.56 MHz.

According to the invention, a p-layer has a multi-layer structure of a first p-layer and a second p-layer, and a diluent gas constituted of an inert gas is used to form the first p-layer. This makes it possible to suppress reduction of a light-transmissive metal oxide layer due to $H_2$ plasma and to manufacture a photoelectric conversion device with improved light absorption amount and light transmittance.

When a material gas for forming the first p-layer is used with an oxidizing gas added thereto, the reduction of the light-transmissive metal oxide layer due to $H_2$ plasma can further be suppressed.

When the surface of the first p-layer is irradiated with plasma of an inert gas, a hydrogen gas or a mixture of a hydrogen gas and an oxidizing gas, the reduction of the light-transmissive metal oxide layer due to $H_2$ plasma can further be suppressed. Especially, irradiation with plasma of the mixture of the hydrogen gas and the oxidizing gas makes it possible to improve the light absorptivity of the resulting p-layer.

When thin second p-layers are intended, a plurality of layers are formed with plasma irradiation performed each time the layer of a predetermined thickness is obtained so that a further reduction of the amount of light absorption was achieved in the second p-layers. This allows further improvement of the short-circuit current, increases p-type impurities introduced during the plasma process and decreases the series resistance to improve F.F.

When the frequency, irradiation time and/or power of the plasma process is sequentially decreased each time it is performed on the surface of the second p-layers deposited to a predetermined thickness, junction characteristics at the p-i interface can be improved further to improve F.F.

Furthermore, when the first p-layer and the second p-layers are formed in the same chamber of a film forming apparatus, e.g., plasma gas phase growing apparatus, there is no need for designing any special doping profile, which remarkably reduces the production costs and simplifies the manufacture.

When the p-layer and the i-layer are formed in different chambers of a film forming apparatus, e.g., plasma gas phase growing apparatus, internal electric fields in the i-layer can be easily controlled since there is no excessive diffusion of p-type impurities in the i-layer. This leads to suppression of space charges in the i-layer, so that the efficiency of collection of a photoelectric current is improved, i.e., reduction in F.F is suppressed.

The present invention provides a tandem photoelectric conversion device in which a plurality of pin junction layers are stacked, the photoelectric conversion device comprising an amorphous layer containing both n-type and p-type impurities in an n-layer and a p-type a-Si layer having an optical band gap of 1.85 eV or more. Accordingly, can be formed a p-layer which does not cause any deterioration in film quality attributable to an effect of boron of attracting hydrogen from silicon in the film, while maintaining preferable ohmic contact with the underlying n-layer. This device exhibits sufficient film properties to serve as a window layer without replacing a-Si as a material. This makes it possible to solve problems occur when a boron-doped SiC film is used as a p-layer, i.e., poor junction with a photoelectric conversion layer which leads to recombination of optical carriers, thereby a sufficient open-circuit voltage and fill factor cannot be maintained.

A p-layer adjacent to the n-layer has a p-type impurity concentration which is high on the side of the n-layer and low on the side of the i-layer, and the optical band gap of the same is formed narrow on the side of the n-layer and wide on the side of the i-layer. This makes it possible to maintain preferable ohmic characteristics at the n-p interface and to reduce the amount of light absorbed in the p-layer.

A p-layer adjacent to the n-layer is formed with a structure having at least two layers; an amorphous silicon film doped with p-type impurities to serve as a first p-layer and an amorphous silicon layer to serve as a second p-layer formed by means of discharge-decomposition of a material gas containing no p-type impurities. Those layers are stacked to form a photoelectric conversion device. As a result, the p-layer exhibits sufficient film properties to serve as a window layer so that it does not cause any deterioration in film quality attributable to the effect of boron of attracting hydrogen from silicon in the film, which makes it possible to maintain the response of a second pin junction layer.

What is claimed is:

1. A method for manufacturing a photoelectric conversion device including a plurality of pin junction layers comprising the steps of: forming a first p-layer of an amorphous silicon layer containing a p-type impurity and an n-type impurity adjacently to an n-layer; and forming a second p-layer of an amorphous silicon layer on the first p-layer adjacent to the n-layer by discharge-decomposition of a material gas not containing the p-type impurity, the second p-layer having a p-type impurity concentration gradually decreasing as it is closer to an i-layer.

2. A method according to claim 1, wherein at the step of forming the first p-layer, the amorphous silicon layer is formed to have a thickness of 5 nm or less and contain at least a p-type impurity by use of a material gas and a diluent gas of at least one inert gas free from a reducing gas.

3. A method according to claim 1, wherein the first p-layer is formed using a gas mixture of a material gas and an oxidizing gas of 0.001 to 1.0% by volume of the material gas.

4. A method according to claim 1, wherein the first p-layer is irradiated with plasma of a processing gas comprised of at least one kind of inert gas after the first p-layer is formed.

5. A method according to claim 1, wherein the first p-layer is irradiated with plasma of a processing gas comprised of a hydrogen gas or an inert gas using a high-frequency power source of 1 kHz to 13.56 MHz after the first p-layer is formed.

6. A method according to claim 1, wherein the first p-layer is irradiated with plasma of a processing gas comprised of a gas mixture of a hydrogen gas and an oxidizing gas of 0.001 to 5.0% by volume of the hydrogen gas after the first p-layer is formed.

7. A method according to claim 1, wherein at the formation of the second p-layer, plasma irradiation is performed every time when the second p-layer is deposited to a predetermined thickness, whereby a plurality of the second p-layers are formed.

8. A method according to claim 1, wherein at the formation of the second p-layer, a plasma process is performed on a surface of the second p-layer every time when the second p-layer is deposited to a predetermined thickness while sequentially reducing frequency, irradiation time and/or electric power.

9. A method according to claim 1, wherein the second p-layer is irradiated with plasma of a processing gas comprised of a gas mixture of a hydrogen gas and an oxidizing gas of 0.001 to 5.0% by volume with respect to the hydrogen gas after the second p-layer is formed.

10. A method according to claim 1, wherein the p-layer is formed in a single chamber of a plasma gas phase film forming apparatus.

11. A method according to claim 1, wherein the p-layer and the i-layer are formed in separate chambers of a plasma gas phase film forming apparatus.

12. A method for manufacturing a photoelectric conversion device including one or plural pin junction layers, wherein a p-layer is provided by forming an amorphous silicon layer as a first p-layer with a thickness of 5 nm or less containing at least a p-type impurity by use of a material gas and a diluent gas of at least one inert gas free from a reducing gas, and forming on the first p-layer an amorphous silicon layer as a second p-layer having an impurity concentration which gradually decreases as it is closer to an i-layer.

13. A method according to claim 12, wherein the first p-layer adjacent to an n-layer is formed as an amorphous silicon layer containing a p-type impurity and an n-type impurity derived from the n-layer.

14. A method according to claim 12, wherein the first p-layer is formed using a gas mixture of a material gas and an oxidizing gas of 0.001 to 1.0% by volume of the material gas.

15. A method according to claim 12, wherein the first p-layer is irradiated with plasma of a processing gas comprised of at least one inert gas after the first p-layer is formed.

16. A method according to claim 12, wherein the first p-layer is irradiated with plasma of a processing gas comprised of a hydrogen gas or an inert gas using a high-frequency power source of 1 kHz to 13.56 MHz after the first p-layer is formed.

17. A method according to claim 12, wherein the first p-layer is irradiated with plasma of a processing gas comprised of a gas mixture of hydrogen gas and an oxidizing gas of 0.001 to 5.0% by volume of the hydrogen gas after the first p-layer is formed.

18. A method according to claim 12, wherein at the formation of the second p-layer, plasma irradiation is performed every time when the second p-layer is deposited to a predetermined thickness, whereby a plurality of the second p-layers are formed.

19. A method according to claim 12, wherein at the formation of the second p-layer, a plasma process is performed on a surface of the second p-layer every time when the second p-layer is deposited to a predetermined thickness while sequentially reducing frequency, irradiation time and/or electric power.

20. A method according to claim 12, wherein the second p-layer is irradiated with plasma of a processing gas comprised of a gas mixture of a hydrogen gas and an oxidizing gas of 0.001 to 5.0% by volume with respect to the hydrogen gas after the second p-layer is formed.

21. A method according to claim 12, wherein the p-layer is formed in a single chamber of a plasma gas phase film forming apparatus.

22. A method according to claim 12, wherein the p-layer and the i-layer are formed in separate chambers of a plasma gas phase film forming apparatus.

* * * * *